United States Patent [19]

Bleckmann et al.

[11] Patent Number: 5,332,649
[45] Date of Patent: Jul. 26, 1994

[54] PRODUCTION OF A PHOTOSENSITIVE RECORDING ELEMENT

[75] Inventors: Gerhard Bleckmann, Lampertheim; Thomas Loerzer, Neustadt; Thomas Telser, Weinheim, all of Fed. Rep. of Germany

[73] Assignee: BASF Aktiengesellschaft, Ludwigshafen, Fed. Rep. of Germany

[21] Appl. No.: 994,256

[22] Filed: Dec. 21, 1992

[30] Foreign Application Priority Data

Dec. 21, 1991 [DE] Fed. Rep. of Germany ....... 4142576

[51] Int. Cl.$^5$ .................................................. G03C 1/76
[52] U.S. Cl. .................................... 430/270; 430/271; 430/281
[58] Field of Search ...................... 430/270, 271, 281

[56] References Cited

U.S. PATENT DOCUMENTS

| 4,320,188 | 3/1982 | Heinz et al. | 430/281 |
| 4,423,135 | 12/1983 | Chen et al. | 430/271 |
| 5,049,478 | 9/1991 | Koch et al. | 430/270 |

Primary Examiner—Marion E. McCamish
Assistant Examiner—Mark A. Chapman
Attorney, Agent, or Firm—Keil & Weinkauf

[57] ABSTRACT

For the production of a recording element having a photopolymerizable recording layer comprising at least two individual layers having the same composition or different compositions, located one on top of the other and firmly bonded to one another, the components used for the production of the individual layers are melted together, homogeneously mixed and freed from gaseous constituents in a self-purging, twin-screw extruder. Thereafter, the component mixture is divided into two or more material streams in a manner such that at least one material stream is removed from the extruder, transported by means of a delivery pump to an adapter or to a multilayer die and bonded there with a material stream from the screw extruder after shaping in each case to give sheet-like structures. During transport of the separate material streams, further components may be metered into or mixed with said streams, so that individual layers having the same or different properties are obtained. The individual layers or the recording layer are or is subsequently calendered.

4 Claims, 1 Drawing Sheet

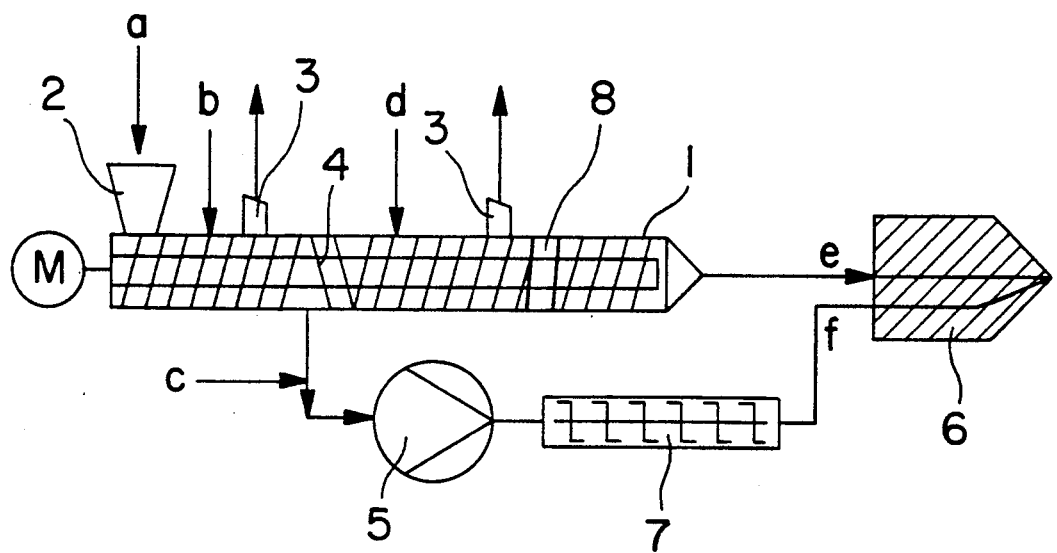

PRODUCTION OF A PHOTOSENSITIVE RECORDING ELEMENT

The production of the genus of the invention starts from a known process according to EP-A-0 362 641, by means of which photosensitive recording elements having a photopolymerizable recording layer comprising at least two individual layers having the same composition or different compositions, located one on top of the other and firmly bonded to one another have been produced to date by a continuous method. The mixtures used for producing the individual layers are melted separately from one another and fed as separate material streams to an adapter or to a multi-layer die, shaped into sheet-like structures lying one on top of the other and then calendered.

A photosensitive recording material whose photopolymerizable recording layer consists of individual layers having the same composition or different compositions and lying one on top of the other is furthermore disclosed in DE-A-29 42 183. Moreover, DE-A-29 42 183 contains the general advice that the individual layers can be laminated together to form a single photopolymerizable recording layer by utilizing their natural tack or by using solvents which effect partial dissolution. Individual layers of different formulations can be used for achieving specific properties, and can be extruded, calendered or pressed with the aid of known methods in one operation.

The conventional processes of this type thus involve processing reactive mixtures in a number of separate mixing units corresponding to the individual layers of the photopolymerizable recording layer, in particular screw extruders. The cost of the apparatus is accordingly high.

It is an object of the present invention to provide a process which permits the continuous production of multilayer, photosensitive recording elements in a simple and economical manner.

We have found that this object is achieved by the measures according to this invention.

Where they are obligatory for all individual layers, the components used for the production of the individual layers of the photopolymerizable recording layer are, according to the invention, melted and mixed together in a single screw extruder shown in the drawing.

Suitable components are thermoplastic polymers, photopolymerization initiators and photopolymerizable olefinically unsaturated compounds (monomers) and, if required, solid and/or liquid additives, with the aid of which the performance characteristics of the recording layer are varied.

Suitable thermoplastic polymers are polyethylene, polypropylene, polvinyl chloride, styrene polymers, in particular styrene/diene copolymers, butadiene and/or isoprene polymers, butadiene/acrylonitrile copolymers (nitrile rubbers ), elastomeric polyurethanes, polyamides, polyimides, polyamidoimides, (meth)acrylate polymers, vinyl chloride/vinyl acetate copolymers, vinylidene chloride polymers, vinyl esters, in particular vinyl acetate, or vinyl propionate polymers, polvinyl alcohols, etc. Depending on the type of thermoplastic polymers used, the general processing conditions known per se for these polymers, for example heat stability, plastication, added assistants, etc., have to be taken into account. Preferably used thermoplastic polymers in addition to the polyurethanes and vinyl alcohol polymers are the elastomeric, rubber-like polymers, in particular the homopolymers of butadiene and of isoprene, the copolymers of butadiene and isoprene with one another and with other copolymerizable monomers, for example nitrile rubbers, such as butadiene/acrylonitrile copolymers containing from 15 to 45% by weight of polymerized acrylonitrile, carboxyl-carrying nitrile rubbers, vinyl chloride-containing nitrile rubbers and the multiblock copolymers of styrene, butadiene and/or isoprene, such as AB two-block copolymers, ABA three-block copolymers, star block copolymers and partially or completely hydrogenated block copolymers of the stated type.

These polymers are used in amounts of from about 40 to about 90%, based on the total weight of the component mixtures.

Advantageous photopolymerization initiators are those which decompose into free radicals on exposure to actinic light, in particular having a wavelength of from 300 to 420 nm, and which are likewise sufficiently heat-stable at the processing temperatures for the production of the sheet-like structure. The suitable photopolymerization initiators include in particular benzoin and benzoin derivatives, such as a-methylbenzoin, α-methylolbenzoin, benzoin methyl ether, benzoin ethyl ether and benzoin isopropyl ether, and the ethers of α-methylbenzoin and of α-methylolbenzoin, 1,2-diketones, eg. diacetyl, benzophenone or benzil, or the derivatives of such diketones, eg. benzil dimethyl ketal, benzil ethylene ketal or benzil methyl ethyl ketal, and compounds of the anthraquinone series and in particular acylphosphine oxide compounds. As a rule, the amount of photopolymerization initiators used is from 0.05 to 5% by weight, based on the sum of all components of the reactive component mixture.

Examples of monomers are in particular the acrylates and methacrylates of monofunctional or polyfunctional alcohols, for example di- and poly(meth)acrylates of ethylene glycol, propylene glycol, butanediol, hexanediol, diethylene glycol, triethylene glycol, tetraethylene glycol, polyethylene glycols having molecular weights of from 200 to 500, trimethylolpropane, pentaerythritol and others. The corresponding monoacrylates and/or monomethacrylates of the stated diols and polyols or of alkanols of 1 to 8 carbon atoms, for example methanol, ethanol, propanol, butanol, 2-ethylhexanol, etc., are also suitable. A further group of ethylenically unsaturated compounds which are particularly suitable when polyamides are used as thermoplastic polymers are the (meth)acrylamides and derivatives of acrylamide and of methacrylamide. Polyester acrylates and polyurethane acrylates are also suitable. The amount of the monomers is in general from about 5 to about 40%, based on the total weight of the component mixture.

In addition, further conventional solid and/or liquid additives may be used for the preparation of the reactive component mixture, for example antioxidants, stabilizers, inhibitors against undesirable premature thermal polymerization, dyes, plasticizers, extrusion assistants, etc. The type of further additives depends primarily on the thermoplastic polymers present and on the desired property profile and the intended use of the recording element. The further additives are used in the conventional amounts known for these substances. In general, the total amount of these further additives does not exceed 40% by weight, based on the sum of all components of the reactive mixture.

The components can be metered in a conventional manner, for example via gear or piston pumps, individually or premixed, into a multiscrew extruder, in particular self-purging, twin-screw extruder having screws rotating in the same direction. Such screw extruders are commercially available. They have a plurality of feed orifices, at least one devolatilization orifice, a discharge orifice connected to an adapter or a multilayer die and at least one orifice for taking off a part stream of the component mixture.

Melting and mixing of the components are carried out under conditions conventionally used in such extruders. It is important that, in spite of the very great viscosity differences between the components, mixing be carried out extremely homogeneously at the same time in a manner which is very gentle to the product, so that no damage or premature reaction of the mixture occurs.

After removal of gaseous constituents, the component mixture is divided into two or more material streams, one of which is conveyed with the aid of the extruder and at least one of which is removed from the extruder and is conveyed with the aid of a delivery pump into a bypass, the latter advantageously being connected tangentially to the extruder. Division into material streams is effected in an extruder zone in which a correspondingly high pressure is built up, for example by means of backward-conveying elements, in order to prevent stalling of the flow. Suitable delivery pumps are, for example, gear pumps or other positive displacement pumps. In general, from about 5 to 35% by weight of the component mixture are removed from the extruder and transported to the adapter or to the multilayer die. During transport of these material streams, further components, in particular additives of the type defined above, can be metered both into the extruder and into the bypass pipe and homogeneously distributed. In this manner, it is possible to produce a recording element having a photopolymerizable recording layer comprising individual layers with different properties.

The present invention is illustrated below by an example with reference to the drawing. In the Example which follows, parts and percentages are by weight, unless stated otherwise.

For the production of a photosensitive recording element consisting of two layers, the following components were used:

a)
  80% by weight (parts/h) of a styrene/isoprene/styrene block copolymer (Cariflex TR 1107);

b) 10% by weight (parts/h) of hexanediol diacrylate,
  10% by weight (parts/h) of hexanediol methacrylate,
  0.7% by weight (parts/h) of 2,6-di-tert-butylcresol,
  0.7% by weight (parts/h) of benzil dimethyl ketal;
c)
  1% by weight (parts/h) of a dispersion of 95% of white oil which contains 60% of paraffinically bonded and 40% of naphthenically bonded carbon and 5% of dye (Oppasin Blue 6470) and
d)
  10% by weight (parts/h) of white oil which contained 60% of paraffinically bonded and 40% of naphthenitally bonded carbon.

Of these, component a) was fed immediately into the feed (2) of a twin-screw extruder (1) and component b) was fed in at the end of the first zone of the extruder. A twin-screw extruder from Werner & Pfleiderer, Stuttgart, having three zones and tightly intermeshing screws rotating in the same direction was used. The screw diameter was 53 mm and the total length of the screw was 35 D.

At (3), the component mixture of a) and b) was devolatilized and thereafter, before the back-conveying element (4), 5% of the component mixture was removed from the extruder. This part stream was conveyed in a bypass pipe by means of a gear pump (5), component (c) being metered in at the suction side of the pump. The component mixture was then transported into a multilayer die (6) by means of a static mixer (7).

Component d) was fed to the component mixture remaining in the extruder, and the mixture was devolatilized before a kneading block (8) and likewise fed to the multilayer die (6).

In the multilayer die, individual layers were formed from the material streams e) and f) and were bonded to one another. The laminate was then calendered. The recording element thus obtained had a total thickness of 2.84 mm.

We claim:

1. A process for the production of a photosensitive recording element having a photopolymerizable recording layer comprising at least two individual layers having the same composition or different compositions, located one on top of the other and firmly bonded to one another, in which components used for the production of the individual layers are melted, homogeneously mixed and freed from gaseous constituents in a self-purging, twin-screw extruder, the component mixture is transported as separate material streams and the latter are combined in an adapter or a multilayer die with formation of the individual layers and said layers are then calendered, wherein the components which are obligatory for all individual layers are melted and mixed together in a screw extruder and, after removal of gaseous constituents, the component mixture is divided into two or more material streams, at least one of which is removed from the screw extruder and is transported by means of a delivery pump to the adapter or to the multilayer die, further components being mixed with this material stream during this transport.

2. A process as claimed in claim 1, wherein further components are mixed with the material stream transported by means of the screw extruder.

3. A process as claimed in claim 1, wherein the further components are metered, at the suction side of the delivery pump, into the material stream removed from the screw extruder.

4. A process as claimed in claim 1, wherein the material stream removed from the screw extruder and the additional components are mixed in a static mixer.

* * * * *